(12) United States Patent
Matsuyama et al.

(10) Patent No.: US 11,376,826 B2
(45) Date of Patent: Jul. 5, 2022

(54) MULTI-LAYER FILM AND METAL LAMINATE

(71) Applicant: Arisawa Mfg. Co., Ltd., Niigata (JP)

(72) Inventors: Hiroyuki Matsuyama, Niigata (JP); Makoto Tai, Niigata (JP); Akira Fujita, Niigata (JP); Takayuki Mayama, Niigata (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 0 days.

(21) Appl. No.: 17/041,965

(22) PCT Filed: Mar. 19, 2019

(86) PCT No.: PCT/JP2019/011557
§ 371 (c)(1),
(2) Date: Sep. 25, 2020

(87) PCT Pub. No.: WO2019/188611
PCT Pub. Date: Oct. 3, 2019

(65) Prior Publication Data
US 2021/0170732 A1 Jun. 10, 2021

(30) Foreign Application Priority Data

Mar. 30, 2018 (JP) .............................. JP2018-067659

(51) Int. Cl.
*B32B 27/28* (2006.01)
*B32B 15/08* (2006.01)
(Continued)

(52) U.S. Cl.
CPC .............. *B32B 27/281* (2013.01); *B32B 7/02* (2013.01); *B32B 15/08* (2013.01); *B32B 27/08* (2013.01); *B32B 27/322* (2013.01); *B32B 2250/05* (2013.01); *B32B 2250/42* (2013.01); *B32B 2307/422* (2013.01); *B32B 2311/12* (2013.01);
(Continued)

(58) Field of Classification Search
CPC ......... H05K 1/03–1/056; B32B 27/281; B32B 27/322
See application file for complete search history.

(56) References Cited

U.S. PATENT DOCUMENTS 5,106,673 A * 4/1992 Effenberger ........... H05K 1/036
428/377
2010/0282488 A1 11/2010 Zheng et al.

FOREIGN PATENT DOCUMENTS

CN 101939796 A 1/2011
EP 2503558 A1 12/2008
(Continued)

OTHER PUBLICATIONS

Machine translation of JP2012006149. Retrieved Jul. 16, 2021.*
(Continued)

*Primary Examiner* — Prashant J Khatri
(74) *Attorney, Agent, or Firm* — Wolf, Greenfield & Sacks, P.C.

(57) ABSTRACT

A multilayer film including alternately-laminated fluororesin layers and polyimide resin layers, wherein a total number of the fluororesin layers and the polyimide resin layers is five or more, a ratio of the total thickness of the fluororesin layers to the thickness of the whole multilayer film is 50% or more, and at least one of the outermost layers of the multilayer film is a fluororesin layer.

13 Claims, 3 Drawing Sheets

(51) Int. Cl.
 B32B 27/08 (2006.01)
 B32B 27/32 (2006.01)
 B32B 7/02 (2019.01)
(52) U.S. Cl.
 CPC ....... *B32B 2311/24* (2013.01); *B32B 2311/30* (2013.01); *B32B 2379/08* (2013.01); *Y10T 428/2495* (2015.01)

(56) References Cited

FOREIGN PATENT DOCUMENTS

| | | |
|---|---|---|
| JP | 4029732 B2 | 1/2008 |
| JP | 2012-006149 A | 1/2012 |
| JP | 2015-106629 A | 6/2015 |
| JP | 2017-136755 A | 8/2017 |
| TW | 201032680 A | 9/2010 |
| WO | WO 2009/085255 A2 | 7/2009 |
| WO | WO 2010/084867 A1 | 7/2010 |

OTHER PUBLICATIONS

Liew et al. "Signal Transmission Loss due to Copper Surface Roughness in High-Frequency Region", IPC APEX EXPO 2014, (2014); pp. 1-14.*
Machine translation of JP 2015-106629. Retrieved Feb. 16, 2022.*
International Search Report and Written Opinion for Application No. PCT/JP2019/011557, dated Jun. 25, 2019.
International Preliminary Report on Patentability for Application No. PCT/JP2019/011557, dated Oct. 15, 2020.

* cited by examiner

MULTI-LAYER FILM AND METAL LAMINATE

CROSS-REFERENCE TO RELATED APPLICATIONS

This application is a national stage filing under 35 U.S.C. 371 of International Patent Application No. PCT/JP2019/011557, filed Mar. 19, 2019, which claims priority to Japanese Application No. 2018-067659, filed Mar. 30, 2018. The entire contents of these applications are incorporated herein by reference in their entirety.

TECHNICAL FIELD

The present invention relates to a multilayer film and a metal laminate.

BACKGROUND ART

Polyimide resin is widely used as an insulating material for flexible printed circuit boards (FPCs). However, with the recent increases in communication speed of electronic devices and improvements in automobile safety functions, such as equipping with millimeter wave radar, there is a need for better high-speed transmission (low transmission loss), but meeting these needs with only the characteristics of polyimide resin is becoming difficult. It is known that the dielectric constant and the dielectric loss tangent (hereinafter, collectively referred to as dielectric properties) of the insulating material have an influence on high-speed transmission. As insulating materials having excellent dielectric properties, attention is being given to fluororesins (PTFE etc.) and liquid crystal polymers (LCPs). However, these materials do not have sufficient adhesiveness to different materials such as a metal foil, and when a fluororesin is used, laser processability at the time of circuit formation is not sufficient. Further, since fluororesins have a large linear expansion coefficient (CTE) and insufficient dimensional stability, it is difficult to use fluororesins alone for the insulating layer of an FPC material. Therefore, a rigid material in which a glass substrate, such as a glass cloth, having excellent dimensional stability is impregnated with a fluororesin to impart high dimensional stability is widely used. However, a disadvantage is that, when a glass substrate such as glass cloth is used, the thickness of the product is increased, and further, the dielectric constant of the glass itself is high, which causes the dielectric constant of the product to increase. As means for solving such a problem, multilayer films of a polyimide resin and a fluororesin have been studied as an insulating layer of an FPC material.

For example, Patent Literature 1 discloses that a circuit board having an extremely small transmission loss even in a high frequency band and excellent dimensional stability can be obtained by laminating, in order, (A) a copper foil/(B) a polyimide layer/(C) a fluororesin layer/(D) a polyimide layer/(E) a fluororesin layer/(F) a polyimide layer/(G) a copper foil, wherein the polyimide layer (B) and the polyimide layer (F) are predetermined polyimide layers, and the linear expansion coefficient of the polyimide layer (D) is set to a specific value or less.

Patent Literature 2 discloses that a multilayer polyimide film in which a fluororesin layer is laminated on at least one surface of a polyimide film having a thickness of 15 µm or less has a low dielectric constant and a low linear expansion coefficient. In the Examples of Patent Literature 2, a multilayer film obtained by forming a primer layer on both surfaces of a polyimide film and forming a fluororesin layer on the primer layer is disclosed.

Patent Literature 3 discloses a polyimide substrate obtained by laminating a thermocompression-bonding multilayer polyimide film having a predetermined thickness and fluororesin film on at least one side of an aromatic polyimide layer by a predetermined method. Patent Literature 3 discloses that this polyimide substrate can impart a low dielectric constant while maintaining the characteristics of the high heat-resistance polyimide film. In addition, in the Examples of Patent Literature 3, a copper foil laminate obtained by sequentially stacking a fluororesin film and a copper foil on both surfaces of a thermocompression-bonding three-layer extruded polyimide film is disclosed.

CITATION LIST

Patent Literature

Patent Literature 1: Japanese Patent Laid-Open No. 2015-106629
Patent Literature 2: Japanese Patent Laid-Open No. 2017-136755
Patent Literature 3: Japanese Patent No. 4029732

SUMMARY OF INVENTION

Technical Problem

However, the circuit board of Patent Literature 1 needs to lower transmission loss much further.

In the Examples of Patent Literature 2, the multilayer film uses an adhesive film between the fluororesin and the copper foil layers in order to increase the adhesiveness between the layers, but there is no disclosure about direct adhesiveness between the fluororesin and the copper foil. In a copper foil laminate obtained using such a multilayer film, acrylic resin and epoxy resin, which are components of the adhesive film, are present in the vicinity of the copper foil, and thus dielectric properties are insufficient. Moreover, the laser processability for forming a circuit on the copper foil laminate is not sufficient.

In the Examples of Patent Literature 3, the multilayer film has a three-layer structure of fluororesin/polyimide resin/fluororesin. In such a structure, the thickness of the fluororesin layer needs to be increased in order to secure sufficient dielectric properties. However, by doing so, the laser processability for forming the circuit is not sufficient.

Therefore, it is an object of the present invention to provide a multilayer film and a metal laminate that can simultaneously achieve excellent laser processability, dielectric properties, dielectric breakdown resistance, and high-speed transmission properties.

Solution to Problem

As a result of intensive investigations to solve the above-described problem, the inventors discovered that the problem can be solved by a multilayer film comprising alternately-laminated fluororesin layers and polyimide resin layers, wherein a total number of the fluororesin layers and the polyimide resin layers is a specific value or more, a ratio of the total thickness of the fluororesin layers to the thickness of the whole multilayer film is a specific value or more, and at least one of the outermost layers of the multilayer film is a fluororesin layer, to thereby complete the present invention.

Specifically, the present invention is as follows.

(1) A multilayer film comprising alternately-laminated fluororesin layers and polyimide resin layers, wherein a total number of the fluororesin layers and the polyimide resin layers is five or more, a ratio of the total thickness of the fluororesin layers to the thickness of the whole multilayer film is 50% or more, and at least one of the outermost layers of the multilayer film is a fluororesin layer.

(2) The multilayer film according to (1), wherein both outermost layers of the multilayer film are fluororesin layers.

(3) The multilayer film according to (1) or (2), wherein the polyimide resin layer has a linear expansion coefficient of 25 ppm/K or less, and the polyimide resin layer has a thickness of 25 μm or less.

(4) The multilayer film according to any one of (1) to (3), wherein the fluororesin layer has a thickness of 50 μm or less.

(5) The multilayer film according to any one of (1) to (4), wherein the thickness of a fluororesin layer in the outermost layers is equal to or less than the thickness of a fluororesin layer in an inner layer of the multilayer film.

(6) A metal laminate, comprising the multilayer film according to any one of (1) to (5) and a metal foil arranged on at least one surface of the multilayer film.

(7) The metal laminate according to (6), wherein the metal foil is any one or more selected from the group consisting of a copper foil, a copper alloy foil, a stainless steel foil, and an aluminum foil.

(8) The metal laminate according to (6) or (7), wherein the metal foil has a surface roughness (Rz) of 1.5 μm or less.

Advantageous Effects of Invention

According to the present invention, it is possible to provide a multilayer film and a metal laminate that are capable of simultaneously achieving excellent laser processability, dielectric properties, dielectric breakdown resistance, and high-speed transmission properties.

A mode for carrying out the present invention (hereinafter, referred to as "this embodiment") is now described in detail. It should be noted that the present invention is not limited to the following mode, and can be variously modified and carried out within the scope of the spirit of the invention.

In the present specification, "dielectric breakdown resistance" refers to the property of being able to suppress dielectric breakdown when used as an insulating material even when voltage is increased.

[Multilayer Film]

The multilayer film of this embodiment is a multilayer film that comprises alternately-laminated fluororesin layers and polyimide resin layers. A total number of the fluororesin layers and the polyimide resin layers is five or more. A ratio of the total thickness of the fluororesin layers to the thickness of the whole multilayer film is 50% or more. At least one of the outermost layers of the multilayer film is a fluororesin layer. By having such a structure, the multilayer film of this embodiment can simultaneously achieve excellent laser processability, dielectric properties, dielectric breakdown resistance, and high-speed transmission properties.

Figure 1:
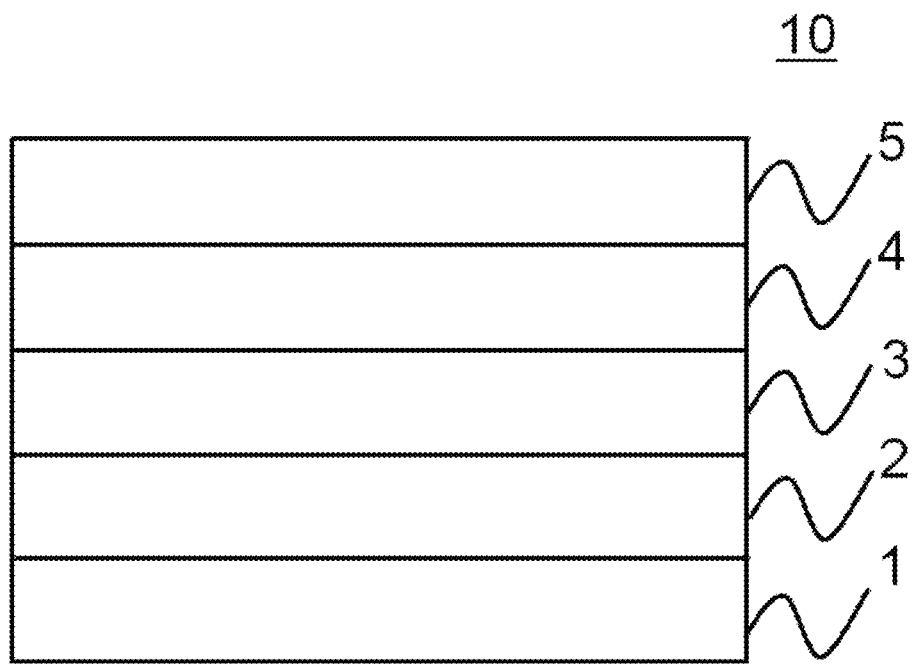
FIG. 1 is a schematic cross-sectional view showing an example of a multilayer film of the present invention.

FIG. 1 shows an example of the multilayer film of this embodiment. In a multilayer film 10 shown in FIG. 1, a fluororesin layer 1, a polyimide resin layer 2, a fluororesin layer 3, a polyimide resin layer 4, and a fluororesin layer 5 are laminated in that order.

The multilayer film of this embodiment has a structure in which fluororesin layers and polyimide resin layers are alternately laminated, and the total number of fluororesin layers and polyimide resin layers (lamination number) is five or more. By having such a structure, the number of insulating layers (fluorine resin layers and polyimide resin layers) and the number of interfaces are increased, and as a result, the multilayer film has excellent dielectric breakdown resistance in the thickness direction. In addition, since the multilayer film has a polyimide resin layer, it is possible to suppress unnecessary scraping (boring) during laser processing when used for a circuit material or the like, and the multilayer film has excellent conduction reliability due to plating processing after the laser processing. The multilayer film of this embodiment has a structure in which the ratio of the total thickness of the fluororesin layers to the thickness of the whole multilayer film is 50% or more. By having such a structure, the multilayer film has excellent dielectric properties. The multilayer film of this embodiment has a structure in which at least one of the outermost layers is a fluororesin layer. By having such a structure, the multilayer film of this embodiment has excellent adhesive strength with a metal foil (for example, copper foil) and high-speed transmission properties.

(Fluororesin Layer)

The fluororesin in the fluororesin layer is not particularly limited as long as it is a resin-containing fluorine. Examples of the fluororesin include a polymer (hereinafter, referred to as a "fluorine-containing polymer") containing a monomer having a fluorine atom (hereinafter, referred to as "fluorine-containing monomer") as a polymerization component. The fluorine-containing polymer may be a homopolymer formed from one type of polymerization component or a copolymer formed from of two or more types of polymerization components.

Examples of the fluorine-containing monomer include unsaturated fluorohydrocarbons (for example, fluoroolefins such as tetrafluoroethylene, hexafluoropropylene, and chlorotrifluoroethylene), and ether group-containing unsaturated fluorohydrocarbons (for example, fluorinated alkyl vinyl ether). These fluorine-containing monomers may be used alone or in combination of two or more.

Examples of the fluorine-containing polymer include polytetrafluoroethylene (PTFE), tetrafluoroethylene-perfluoroalkyl vinyl ether copolymer (PFA), tetrafluoroethylene-hexafluoropropylene copolymer (FEP), polychlorotrifluoroethylene (PCTFE), chlorotrifluoroethylene-ethylene copolymer (ECTFE), and polyvinylidene fluoride (PVDF). These fluorine-containing polymers may be used alone or in combination of two or more. Among these, from the viewpoint of even better adhesion to the metal foil, the fluorine-containing polymer is preferably one or more selected from the group consisting of PTFE, PFA, and FEP, and is more preferably PFA.

The fluororesin may be a prepared product prepared by a known method or a commercially available product. Examples of commercially available products include "Neoflon FEP" and "Neoflon PFA" manufactured by Daikin Industries, Ltd., and "JUNFLON" manufactured by Junkosha Inc.

The fluororesin layer may optionally include components other than the fluororesin as long as the effects of the present invention are not impaired. For example, colorants such as dyes and pigments may be added to improve laser processability. The content of the fluororesin in the fluororesin layer is not particularly limited and may be, for example, 50% by mass or more.

The thickness of the fluororesin layer is preferably 50 μm or less. By setting the thickness to 50 μm or less, the multilayer film of this embodiment tends to have even better laser processability. From the same viewpoint, the thickness of the fluororesin layer is more preferably 40 μm or less, further preferably 30 μm or less, and particularly preferably 25 μm or less.

(Polyimide Resin)

Examples of the polyimide resin in the polyimide resin layer include a thermoplastic polyimide resin and a thermosetting polyimide resin. From the viewpoint that the linear expansion coefficient is small, the polyimide resin is preferably a thermosetting polyimide resin. Examples of the thermosetting polyimide resin include a condensation type polyimide resin obtained by copolymerizing an acid dianhydride and a diamine, a bismaleimide resin, and a maleimide resin. A condensation type polyimide resin is preferable.

The acid dianhydride and the diamine may be any of an aliphatic compound, an alicyclic compound, and an aromatic compound. From the viewpoint of heat resistance, the acid dianhydride is preferably an aromatic tetracarboxylic acid dianhydride, and the diamine is preferably an aromatic diamine.

Examples of the acid dianhydride include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 4,4'-oxydiphthalic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, bis(3,4-dicarboxyphenyl)sulfone dianhydride, p-phenylenebis(trimellitic acid monoester anhydride), ethylene bis(trimellitic acid monoester anhydride), bisphenol A bis(trimellitic acid monoester anhydride), 2,2 bis(3,4-dicarboxyphenyl)hexafluoropropane dianhydride, and 2,2-bis(4-(3,4-dicarboxyphenoxy)phenyl) hexafluoropropane dianhydride. These acid dianhydrides may be used alone or in combination of two or more.

Examples of the diamine include p-phenylenediamine, m-phenylenediamine, 2,4-diaminotoluene, 2,5-diaminotoluene, 2,4-diaminoxylene, 2,4-diaminodurene, 4,4'-diaminodiphenylmethane, 4,4'-methylenebis(2-methylaniline), 4,4'-methylenebis(2-ethylaniline), 4,4'-methylenebis(2,6-dimethylaniline), 4,4'-methylenebis(2,6-diethylaniline), 4,4'-diaminodiphenyl ether, 3,4'-diaminodiphenyl ether, 3,3'-diaminodiphenyl ether, 2,4'-diaminodiphenyl ether, 4,4'-diaminodiphenyl sulfone, 3,3'-diaminodiphenyl sulfone, 4,4'-diaminobenzophenone, 3,3'-diaminobenzophenone, 4,4'-diaminobenzanilide, benzidine, 3,3'-dihydroxybenzidine, 3,3'-dimethoxybenzidine, o-tolidine, m-tolidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, 4,4'-bis(4-aminophenoxy) biphenyl, bis(4-(3-aminophenoxy)phenyl)sulfone, bis(4-(4-aminophenoxy)phenyl)sulfone, 2,2-bis(4-(4-aminophenoxy)phenyl)propane, 2,2-bis(4-(4-aminophenoxy)phenyl)hexafluoropropane, 2,2-bis(4-aminophenyl) hexafluoropropane, p-terphenylenediamine, 4,4'-methylenebis(cyclohexylamine), isophoronediamine, trans-1,4-diaminocyclohexane, cis-1,4-diaminocyclohexane, 1,4-cyclohexanebis(methylamine), 2,5-bis(aminomethyl)bicyclo[2.2.1]heptane, 2,6-bis(aminomethyl)bicyclo[2.2.1]heptane, 3,8-bis(aminomethyl)tricyclo[5.2.1.0]decane, 1,3-diaminoadamantane, 2,2-bis(4-aminocyclohexyl)propane, 2,2-bis(4-aminocyclohexyl)hexafluoropropane, 1,3-propanediamine, 1,4-tetramethylenediamine, 1,5-pentamethylenediamine, 1,6-hexamethylenediamine, 1,7-heptamethylenediamine, 1,8-octamethylenediamine, and 1,9-nonamethylenediamine. These diamines may be used alone or in combination of two or more.

The polyimide resin may be a prepared product prepared by a known method or a commercially available product. Examples of commercially available products include products in the "Kapton EN series", "Kapton H series", and "Kapton V series" manufactured by Dupont-Toray Co., Ltd., products in the "Apical HP series" and "Apical NPI series" manufactured by Kaneka Corporation, and "Upilex S" manufactured by Ube Industries, Ltd.

The polyimide resin layer may optionally include components other than the polyimide resin as long as the effects of the present invention are not impaired. Examples of components other than the polyimide resin include a liquid crystal polymer resin, a polyether ether ketone resin, a polyphenylene sulfide resin, and an epoxy resin. The content of the polyimide resin in the polyimide resin layer is not particularly limited. For example, the content may be 50% by mass or more.

The linear expansion coefficient of the polyimide resin layer is preferably 25 ppm/K or less. By setting the linear expansion coefficient to 25 ppm/K or less, the multilayer film of this embodiment tends to have even better heat resistance and dimensional stability. The term "dimensional stability" as used herein refers to dimensional stability when the multilayer film is used for a metal laminate or the like. From the same viewpoint, the linear expansion coefficient is more preferably 24 ppm/K or less, and further preferably 23 ppm/K or less. The linear expansion coefficient is obtained by, for example, the method described in the examples described later.

The thickness of the polyimide resin layer is preferably 25 μm or less. By setting the thickness to 25 μm or less, laser processability and moisture absorption resistance tend to be even better. From the same viewpoint, the thickness of the polyimide resin layer is more preferably 20 μm or less, further preferably 15 μm or less, and particularly preferably 12.5 μm or less.

The multilayer film of this embodiment has a structure in which fluororesin layers and polyimide resin layers are alternately laminated, and the total number (lamination number) of the fluororesin layers and the polyimide resin layers is five or more. By having such a structure, the number of insulating layers (fluorine resin layers and polyimide resin layers) and the number of interfaces are increased, and as a result, the multilayer film has excellent withstand voltage in the thickness direction and excellent dielectric breakdown resistance. From the same viewpoint, the total number of layers is preferably six or more, and more preferably seven or more. Further, since the multilayer film has a polyimide resin layer, it has excellent laser processability.

In the multilayer film of this embodiment, the number of types of each resin layer of the fluororesin layer and the polyimide resin layer may be one type, or may be two or more types.

In the multilayer film of this embodiment, the ratio of the total thickness of the fluororesin layers to the thickness of the whole multilayer film is 50% or more. By setting this ratio to 50% or more, the multilayer film has excellent dielectric properties. From the same viewpoint, the ratio is preferably 60% or more, more preferably 70% or more, and further preferably 75% or more.

The thickness of the multilayer film of this embodiment is, for example, 20 to 300 µm, and from the viewpoints of handleability and low transmission loss, is preferably 50 to 300 µm, and more preferably 75 to 250 µm.

The multilayer film of this embodiment has a structure in which at least one of the outermost layers of the multilayer film is a fluororesin. By having such a structure, the multilayer film of this embodiment has excellent adhesive strength to a circuit (for example, metal foil such as copper foil) and high-speed transmission properties. From the viewpoint of adhesive strength to the circuit and high-speed transmission properties, the resin layer in contact with the circuit is preferably a fluororesin layer. When the circuit is formed on both surfaces of the multilayer film, both outermost layers are preferably fluororesin layers.

The multilayer film of this embodiment preferably has a structure in which the thickness of the fluororesin layer at the outermost layer is equal to or less than the thickness of a fluororesin layer in an inner layer of the multilayer film. By having such a structure, the multilayer film tends to have even better laser processability.

[Metal Laminate]

The metal laminate (metal laminated body) of this embodiment includes the multilayer film of this embodiment and a metal foil arranged on at least one surface of the multilayer film. By including the multilayer film of this embodiment, the metal laminate of this embodiment has excellent laser processability, dielectric properties, dielectric breakdown resistance, and high-speed transmission properties.

Figure 2:
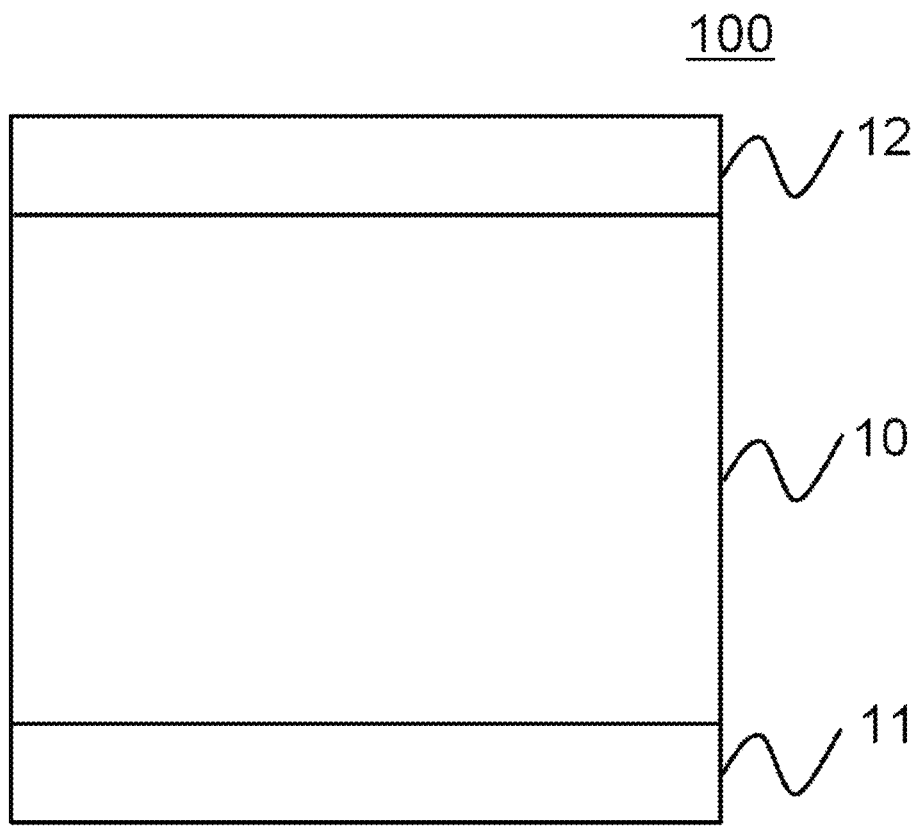
FIG. 2 is a schematic cross-sectional view showing an example of a metal laminate of the present invention.

FIG. 2 shows an example of the metal laminate of this embodiment. In a metal laminate 100 shown in FIG. 2, metal foils 11 and 12 are arranged on both surfaces of the multilayer film 10 shown in FIG. 1.

The metal laminate may have a form in which metal foils are arranged on both surfaces of the multilayer film, or may have a form in which a metal foil is arranged on only one surface of the multilayer film.

(Metal Foil)

The metal foil is not particularly limited, and is preferably one or more selected from the group consisting of a copper foil, a copper alloy foil, a stainless steel foil, and an aluminum foil. More preferably, the metal foil is a copper foil.

The thickness of the metal foil is not particularly limited, and may be, for example, about 6 to 70 µm.

The surface roughness (Rz) of the metal foil is preferably 1.5 µm or less. When the surface roughness is 1.5 µm or less, the metal laminate tends to be able to reduce the skin effect of the conductor of the circuit material when used as a circuit material, and as a result, tends to be able to improve a property of having low transmission loss. The surface roughness (Rz) of the metal foil is more preferably 1.3 µm or less.

(Method for Producing Metal Laminated Body)

The method for producing the metal laminated body of this embodiment is not particularly limited, and a known method is used. A specific example of the method for producing the metal laminated body is a method in which a metal foil is press-laminated on at least one of both surfaces of the multilayer film of this embodiment. In the press lamination method, the pressing temperature is not particularly limited and may be about 250 to 350° C. The pressure is not particularly limited, and may be about 3 to 5 MPa, for example.

The methods for evaluating and measuring the physical properties described above can be, unless otherwise specified, carried out according to the methods described in the following examples.

EXAMPLES

The present invention will be described more specifically with reference to examples and comparative examples, but the present invention is not limited to these examples.

The materials used in the examples and comparative examples are as follows.

(Fluororesin Layer)

Fluorine resin film ("Neoflon FEP" manufactured by Daikin Industries, Ltd.; hereinafter, also referred to as "FEP")

Fluorine resin film ("JUNFLON" manufactured by Junkosha Inc.; hereinafter also referred to as "PFA")

(Polyimide Resin Layer)

Polyimide resin film ("Kapton EN" manufactured by Dupont-Toray Co., Ltd., with a CTE of 16 ppm/K; hereinafter, also referred to as "Kapton EN".)

Polyimide resin film ("Upilex S" manufactured by Ube Industries, Ltd., with a CTE of ppm/K; hereinafter, also referred to as "Upilex S".)

(Metal Foil)

Copper foil ("CF-T49A-DS-HD2-12 µm" manufactured by Fukuda Metal Foil & Powder Co., Ltd.; hereinafter, also referred to as "low-roughness copper foil".)

Copper foil ("CF-H9A-DS-HD2-12 µm" manufactured by Fukuda Metal Foil & Powder Co., Ltd.; hereinafter, also referred to as "normal-roughness copper foil".)

Synthesis Example 1

A reaction vessel was charged with 68 g of N-methyl-2-pyrrolidone (NMP), 2.4933 g of p-phenylenediamine (p-PDA), and 1.1542 g of 4,4'-oxydianiline (ODA), and the mixture was then stirred at room temperature to dissolve the p-PDA and the ODA in the NMP. The resultant solution was gradually charged with 8.3524 g of 3,3',4,4'-biphenyltetracarboxylic dianhydride (BPDA), and the resultant mixture was then stirred at room temperature for 3 hours to obtain a resin composition (polyamic acid solution).

Production Example 1

The polyamic acid solution obtained in Synthesis Example 1 was applied on a roughened surface of the low-roughness copper foil using a bar coater so that the resin layer thickness after imidization was 12.5 µm, and dried at 130° C. for 10 minutes. The copper foil on which the polyamic acid solution had been applied and dried was cooled to room temperature and then heated in a stepwise manner to 360° C. (material temperature). After holding at 360° C. for 2 hours, the copper foil was naturally cooled to room temperature to obtain a two-layer flexible metal laminate (hereinafter, also referred to as "CCL") formed from a copper foil and a polyimide layer. The linear expansion coefficient (hereinafter, also referred to as "CTE") of the obtained polyimide layer was 18 ppm/K.

Example 1

A metal laminate in which the copper foil was arranged on both surfaces of a multilayer film was produced by stacking, in that order, the low-roughness copper foil, PFA having a thickness of 25 µm, Kapton EN having a thickness of 12.5 µm, PFA having a thickness of 25 µm, Kapton EN having a thickness of 12.5 µm, PFA having a thickness of 25 µm, and the low-roughness copper foil, and then press-laminating the stack for 10 minutes under the conditions of a temperature of 320° C. and a pressure of 4 MPa.

Example 2

A metal laminate in which the copper foil was arranged on both surfaces of a multilayer film was produced by stacking, in order, the low-roughness copper foil, PFA having a thickness of 12.5 µm, Kapton EN having a thickness of 12.5 µm, PFA having a thickness of 50 µm, Kapton EN having a thickness of 12.5 µm, PFA having a thickness of 12.5 µm, and the low-roughness copper foil, and then press-laminating the stack for 10 minutes under the conditions of a temperature of 320° C. and a pressure of 4 MPa.

Example 3

A metal laminate in which the copper foil was arranged on both surfaces of a multilayer film was produced by stacking, in order, the low-roughness copper foil, PFA having a thickness of 12.5 µm, Kapton EN having a thickness of 25 µm, PFA having a thickness of 25 µ, Kapton EN having a thickness of 25 µm, PFA having a thickness of 12.5 µm, and the low-roughness copper foil, and then press-laminating the stack for 10 minutes under the conditions of a temperature of 320° C. and a pressure of 4 MPa.

Example 4

A metal laminate in which the copper foil was arranged on both surfaces of a multilayer film was produced by stacking, in order, the low-roughness copper foil, PFA having a thickness of 12.5 µm, Kapton EN having a thickness of 12.5 µm, PFA having a thickness of 12.5 µm, Kapton EN having a thickness of 25 µm, PFA having a thickness of 12.5 µm, Kapton EN having a thickness of 12.5 µm, PFA having a thickness of 12.5 µm, and the low-roughness copper foil, and then press-laminating the stack for 10 minutes under the conditions of a temperature of 320° C. and a pressure of 4 MPa.

Example 5

A metal laminate in which the copper foil was arranged on both surfaces of a multilayer film was produced by stacking, in order, the low-roughness copper foil, FEP having a thickness of 25 µm, Kapton EN having a thickness of 12.5 µm, FEP having a thickness of 25 µm, Kapton EN having a thickness of 12.5 µm, PFA having a thickness of 25 µm, and the low-roughness copper foil, and then press-laminating the stack for 10 minutes under the conditions of a temperature of 320° C. and a pressure of 4 MPa.

Example 6

A metal laminate in which the copper foil was arranged on both surfaces of a multilayer film was produced by stacking, in order, the normal-roughness copper foil, PFA having a thickness of 25 µm, Kapton EN having a thickness of 12.5 µm, PFA having a thickness of 25 µm, Kapton EN having a thickness of 12.5 µm, PFA having a thickness of 25 µm, and the normal-roughness copper foil, and then press-laminating the stack for 10 minutes under the conditions of a temperature of 320° C. and a pressure of 4 MPa.

Example 7

A metal laminate in which the copper foil was arranged on both surfaces of a multilayer film was produced by stacking, in order, the low-roughness copper foil, PFA having a thickness of 25 µm, Upilex S having a thickness of 12.5 µm, PFA having a thickness of 25 µm, Upilex S having a thickness of 12.5 µm, PFA having a thickness of 25 µm, and the low-roughness copper foil, and then press-laminating the stack for 10 minutes under the conditions of a temperature of 320° C. and a pressure of 4 MPa.

Comparative Example 1

A metal laminate in which the copper foil was arranged on both surfaces of a multilayer film was produced by stacking, in order, the low-roughness copper foil, PFA having a thickness of 50 µm, PFA having a thickness of 50 µm, and the low-roughness copper foil, and then press-laminating the stack for 10 minutes under the conditions of a temperature of 320° C. and a pressure of 4 MPa.

Comparative Example 2

A metal laminate in which the copper foil was arranged on both surfaces of a multilayer film was produced by stacking, in order, the low-roughness copper foil, FEP having a thickness of 50 µm, FEP having a thickness of 50 µm, and the low-roughness copper foil, and then press-laminating the stack for 10 minutes under the conditions of a temperature of 320° C. and a pressure of 4 MPa.

Comparative Example 3

A metal laminate in which the copper foil was arranged on both surfaces of a multilayer film was produced by stacking, in order, the low-roughness copper foil, FEP having a thickness of 25 µm, Kapton EN having a thickness of 50 µm, FEP having a thickness of 25 µm, and the low-roughness copper foil, and then press-laminating the stack for 10 minutes under the conditions of a temperature of 320° C. and a pressure of 4 MPa.

Comparative Example 4

A metal laminate in which the copper foil was arranged on both surfaces of a multilayer film was produced by stacking, in order, the CCL obtained in Production Example 1, PFA having a thickness of 12.5 µm, Kapton EN having a thickness of 12.5 µm, PFA having a thickness of 25 µm, Kapton EN having a thickness of 12.5 µm, PFA having a thickness of 12.5 μm, and the CCL obtained in Production Example 1 such that the polyimide surface of the CCL was in contact with the PFA, and then press-laminating the stack for 10 minutes under the conditions of a temperature of 320° C. and a pressure of 4 MPa.

The physical properties of the multilayer films obtained in each of the examples and comparative examples were measured and evaluated by the following methods. The results are shown in Tables 1 and 2.

[Thickness]

The thickness was measured using a Micrometer MDC-25MX manufactured by Mitutoyo Corporation.

[Linear Expansion Coefficient (CTE)]

The linear expansion coefficient was calculated using a thermomechanical analyzer TMA-60 manufactured by Shimadzu Corporation, based on a dimensional change from 100° C. to 200° C. when heating at a rate of increase in temperature of 10° C./min with a sample size of 5 mm in width and 15 mm in length and a weight of 5 g.

[Surface Roughness (Rz)]

A roughened surface of the copper foil was measured according to JIS B0601:1994 using a stylus surface roughness meter.

[Peel Strength]

The peel strength of a sample on which a circuit pattern had been formed by etching the copper foil of the metal laminate so as to have a width of 3 mm and that had been left to stand for 24 hours or more in a 23° C., 50% RH atmosphere (processing conditions A) was measured in a peeling direction of 180° at a pulling rate of 50 mm/min according to item 8.1 of JIS C6471.

◯: Peel strength of 6 N/cm or more ×: Peel strength of less than 6 N/cm

[Dielectric Constant and Dielectric Loss Tangent]

A sample was obtained by removing all of the copper foil of the metal laminate by etching and leaving to stand for 24 hours or more in a 23° C., 50% RH atmosphere. The dielectric constant and dielectric loss tangent at frequencies of 5 GHz and 10 GHz were measured in a 23° C. environment for processing conditions A as well as for a sample that had been dipped in 23° C. pure water for 24 hours (processing conditions D) using a "Network Analyzer N5230A manufactured by Agilent Technologies" by a SPDR method (resonator method).

[Transmission Loss]

A microstrip pattern was designed to have a circuit length of 100 mm and an impedance of 50Ω. A circuit was formed thereon by etching the copper foil of the metal laminate. The transmission loss at a frequency of 20 GHz was measured in a 23° C. environment for processing conditions A and processing conditions D using a Network Analyzer N5247A manufactured by Agilent Technologies with a Fixture 3660-20 GHz manufactured by Anritsu Corporation.

[Moisture Absorption Rate]

A sample from which all the copper foil of the metal laminate had been removed by etching was dried at 105° C. for 0.5 hours, and the sample mass after cooling to room temperature was taken as an initial value (m0). This sample was dipped in 23° C. pure water for 24 hours, the mass (md) after that was measured. The moisture absorption rate under processing conditions D-24/23 was measure using the following expression from the change in mass between the initial value and after dipping.

Moisture absorption rate (%)=(md−m0)×100/m0

[CTE]

A sample obtained by removing all of the copper foil of the metal laminate by etching and leaving to stand for 24 hours or more in a 23° C., 50% RH atmosphere was formed so as to be 5 mm wide and 15 mm long. The CTE in the MD direction and in the TD direction was calculated using a thermomechanical analyzer TMA-60 manufactured by Shimadzu Corporation, based on a dimensional change from 100° C. to 200° C. when heating at a rate of increase in temperature of 10° C./min with a weight of 5 g.

[Laser Processability]

Figure 3:
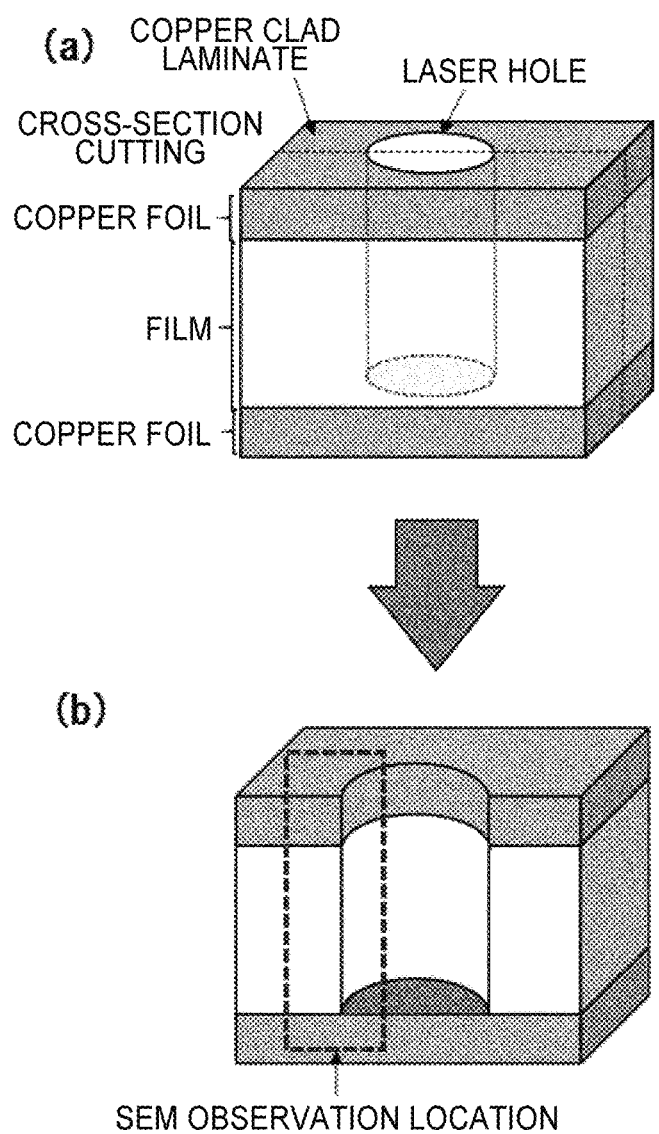
FIG. 3 is a schematic explanatory view for illustrating an SEM observation location.
Figure 4:
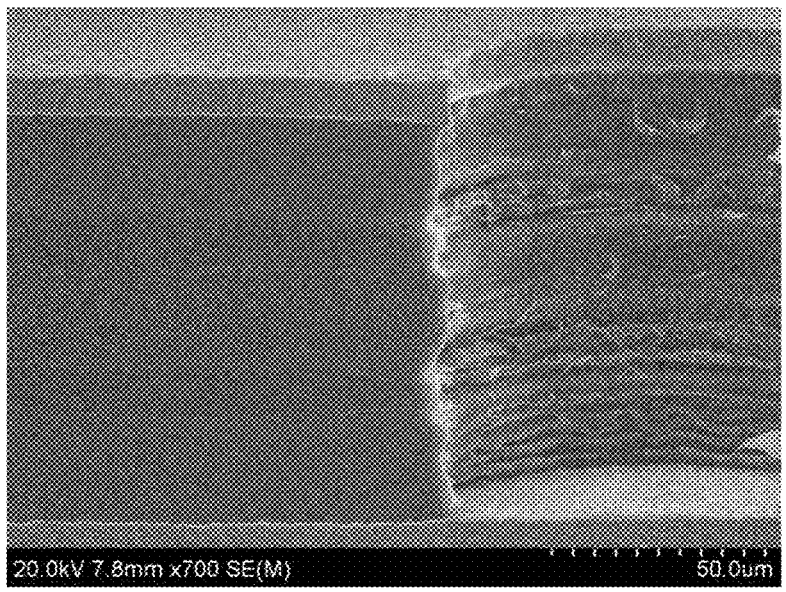
FIG. 4 is a representative observation photograph of Example 1.
Figure 5:
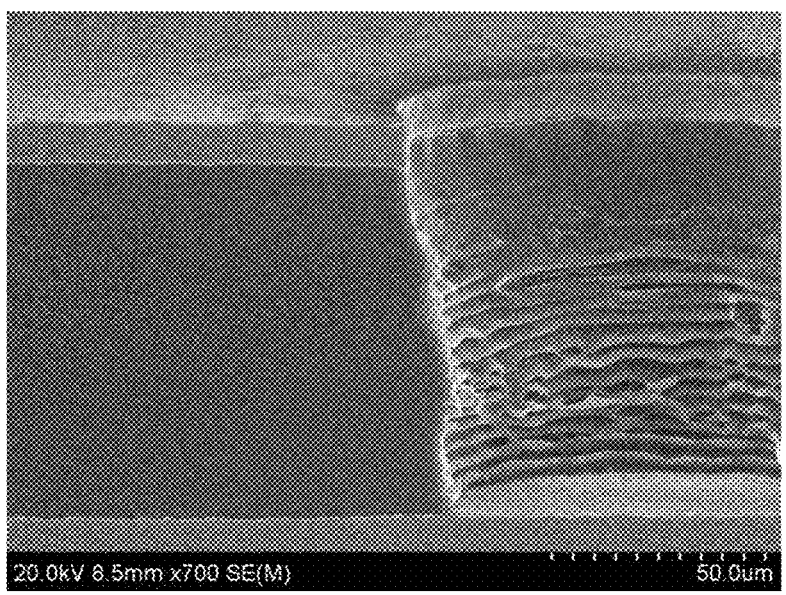
FIG. 5 is a representative observation photograph of Comparative Example 1.

The copper foil of the metal laminate was removed by etching to form a shape with a diameter of 100 μm. Using a laser processing machine LC-2K212 manufactured by Via Mechanics Ltd., drilling was carried out under the conditions of a frequency of 2000 Hz, an output of 11.5 W, and a pulse width of 18 μs. Then, using a scanning microscope (hereinafter, also referred to as "SEM") 5-4800 manufactured by Hitachi High-Technologies Corporation, the shape of the wall surface of the holes was observed under the conditions of an acceleration voltage of 20 kV, a magnification of 700 times, and an observation inclination angle of 10°. Samples having large unevenness (many uneven shapes) in the thickness direction or those having an inclined (tapered) cross-section were evaluated with a "×", and samples having small unevenness (few uneven shapes) or those having a vertical cross-section were evaluated with a "◯". FIG. 3 is a schematic explanatory view for illustrating the SEM observation location. FIG. 3(a) shows a copper clad laminate after drilling had been carried out, and FIG. 3(b) schematically shows a cross-section indicated by the dotted line of the copper clad laminate of FIG. 3(a). The region enclosed by the dotted line shown in FIG. 3(b) was observed by the SEM. A representative observation photograph for Example 1 and for Comparative Example 1 are shown in FIGS. 4 and 5, respectively.

[Dielectric Breakdown Voltage]

The dielectric breakdown voltage of a metal laminate that had been left to stand for 24 hours or more under a 23° C., 50% RH atmosphere was measured under processing conditions A according to item 7.3 of JIS C6471.

As shown in Table 1 and Table 2, when samples having the same fluorine ratio (for example, Examples 3 and 4 and Comparative Examples 5 and 6) are compared, it can be seen that although all the samples have good dielectric properties, the Examples had much better results for laser processability and dielectric breakdown voltage. In addition, when the outermost layer of the multi-layer film was a fluororesin layer, excellent dielectric properties and transmission loss were obtained.

TABLE 1

| Properties | Processing conditions | Example 1 | Example 2 | Example 3 | Example 4 | Example 5 | Example 6 | Example 7 |
|---|---|---|---|---|---|---|---|---|
| Fluororesin layer ratio | — | 75% | 75% | 50% | 50% | 75% | 75% | 75% |
| Number of structural layers | — | 5 layers | 5 layers | 5 layers | 7 layers | 5 layers | 5 layers | 5 layers |

TABLE 1-continued

| Properties | Processing conditions | | Example 1 | Example 2 | Example 3 | Example 4 | Example 5 | Example 6 | Example 7 |
|---|---|---|---|---|---|---|---|---|---|
| Resin type of outermost layer | — | | fluororesin | fluororesin | fluororesin | fluororesin | fluororesin | fluororesin | fluororesin |
| Copper foil roughness (μm) | — | | 1.1 | 1.1 | 1.1 | 1.1 | 1.1 | 1.3 | 1.1 |
| Peel strength (N/cm) | A | 180° | ○ | ○ | ○ | ○ | ○ | ○ | ○ |
| Dielectric constant | A | 5 GHz | 2.46 | 2.43 | 2.73 | 2.89 | 2.34 | 2.38 | 2.48 |
| | | 10 GHz | 2.43 | 2.38 | 2.71 | 2.88 | 2.35 | 2.36 | 2.43 |
| | D | 5 GHz | 2.48 | 2.44 | 2.88 | 3.01 | 2.51 | 2.41 | 2.5 |
| | | 10 GHz | 2.47 | 2.41 | 2.82 | 2.94 | 2.51 | 2.4 | 2.42 |
| Dielectric loss tangent | A | 5 GHz | 0.0034 | 0.0033 | 0.0054 | 0.0056 | 0.0029 | 0.0033 | 0.0038 |
| | | 10 GHz | 0.0036 | 0.0036 | 0.006 | 0.0063 | 0.0031 | 0.0038 | 0.0039 |
| | D | 5 GHz | 0.0063 | 0.0065 | 0.0111 | 0.0101 | 0.0074 | 0.006 | 0.0061 |
| | | 10 GHz | 0.0069 | 0.0072 | 0.0125 | 0.0117 | 0.0066 | 0.0063 | 0.0069 |
| Transmission loss (dB) | A | 20 GHz | −1.34 | −1.32 | −1.6 | −1.64 | −1.2 | −1.41 | −1.35 |
| | D | | −1.43 | −1.49 | −1.78 | −1.81 | −1.27 | −1.55 | −1.45 |
| Moisture absorption rate (%) | D | D-24/23 | 0.39 | 0.42 | 0.83 | 0.85 | 0.35 | 0.4 | 0.32 |
| CTE (ppm/K) | TMA | MD | 23 | 24 | 20 | 23 | 12 | 22 | 18 |
| | | TD | 18 | 21 | 17 | 19 | 2 | 19 | 17 |
| Laser processability | | | ○ | ○ | ○ | ○ | ○ | ○ | ○ |
| Dielectric breakdown voltage (kV) | A | | 15.4 | 15.7 | 16 | 16.5 | 15.8 | 15.2 | 16 |

TABLE 2

| Properties | Processing conditions | | Comparative Example 1 | Comparative Example 2 | Comparative Example 3 | Comparative Example 4 |
|---|---|---|---|---|---|---|
| Fluororesin layer ratio | — | | 100% | 100% | 50% | 50% |
| Number of structural layers | — | | single layer | single layer | 3 layers | 7 layers |
| Resin type of outermost layer | — | | fluororesin | fluororesin | fluororesin | polyimide resin |
| Copper foil roughness (μm) | — | | 1.1 | 1.1 | 1.1 | 1.1 |
| Peel strength (N/cm) | A | 180° | ○ | ○ | ○ | ○ |
| Dielectric constant | A | 5 GHz | 2.08 | 2.09 | 2.73 | 2.73 |
| | | 10 GHz | 2.05 | 2.02 | 2.72 | 2.7 |
| | D | 5 GHz | 2.07 | 2.1 | 2.85 | 2.89 |
| | | 10 GHz | 2.06 | 2.02 | 2.79 | 2.88 |
| Dielectric loss tangent | A | 5 GHz | 0.001 | 0.0012 | 0.0044 | 0.0039 |
| | | 10 GHz | 0.0009 | 0.0009 | 0.0042 | 0.0045 |
| | D | 5 GHz | 0.0009 | 0.0013 | 0.0079 | 0.0093 |
| | | 10 GHz | 0.0011 | 0.0007 | 0.009 | 0.011 |
| Transmission loss (dB) | A | 20 GHz | −1.12 | −1.16 | −1.83 | −2.8 |
| | D | | −1.14 | −1.19 | −2.1 | −3.18 |
| Moisture absorption rate (%) | D | D-24/23 | 0.16 | 0.01 | 0.59 | 0.92 |
| CTE (ppm/K) | TMA | MD | 106 | 124 | 17 | 27 |
| | | TD | 98 | 129 | 13 | 24 |
| Laser processability | | | x | x | ○ | ○ |
| Dielectric breakdown voltage (kV) | A | | 11.1 | 12.6 | 14.2 | 15.8 |

This application is based on a Japanese patent application (Japanese Patent Application No. 2018-067659) filed with the Japan Patent Office on Mar. 30, 2018, the contents of which are incorporated herein by reference.

The invention claimed is:

1. A multilayer film comprising alternately-laminated fluororesin layers and polyimide resin layers, wherein a total number of the fluororesin layers and the polyimide resin layers is five or more, a ratio of a total thickness of the fluororesin layers to a thickness of the whole multilayer film is more than 60%, and at least one of the outermost layers of the multilayer film is a fluororesin layer.

2. The multilayer film according to claim 1, wherein both outermost layers of the multilayer film are fluororesin layers.

3. The multilayer film according to claim 2, wherein the polyimide resin layer has a linear expansion coefficient of 25 ppm/K or less, and the polyimide resin layer has a thickness of 25 μm or less.

4. The multilayer film according to claim 2, wherein the fluororesin layer has a thickness of 50 μm or less.

5. The multilayer film according to claim 2, wherein a thickness of a fluororesin layer in the outermost layers is equal to or less than a thickness of a fluororesin layer in an inner layer of the multilayer film.

6. A metal laminate, comprising the multilayer film according to claim 2 and a metal foil arranged on at least one surface of the multilayer film.

7. The multilayer film according to claim 1, wherein the polyimide resin layer has a linear expansion coefficient of 25 ppm/K or less, and the polyimide resin layer has a thickness of 25 μm or less.

8. The multilayer film according to claim 1, wherein the fluororesin layer has a thickness of 50 μm or less.

9. The multilayer film according to claim 1, wherein a thickness of a fluororesin layer in the outermost layers is equal to or less than a thickness of a fluororesin layer in an inner layer of the multilayer film.

10. A metal laminate, comprising the multilayer film according to claim 1 and a metal foil arranged on at least one surface of the multilayer film.

11. The metal laminate according to claim 10, wherein the metal foil is any one or more selected from the group consisting of a copper foil, a copper alloy foil, a stainless steel foil, and an aluminum foil.

12. The metal laminate according to claim 11, wherein the metal foil has a surface roughness (Rz) of 1.5 μm or less.

13. The metal laminate according to claim 10, wherein the metal foil has a surface roughness (Rz) of 1.5 μm or less.

* * * * *